US009431328B1

(12) United States Patent
Yilmaz et al.

(10) Patent No.: US 9,431,328 B1
(45) Date of Patent: Aug. 30, 2016

(54) POWER DEVICE AND PREPARATION METHOD THEREOF

(71) Applicant: Alpha and Omega Semiconductor Incorporated, Sunnyvale, CA (US)

(72) Inventors: Hamza Yilmaz, Saratoga, CA (US); Yan Xun Xue, Los Gatos, CA (US); Jun Lu, San Jose, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

(21) Appl. No.: 15/007,670

(22) Filed: Jan. 27, 2016

Related U.S. Application Data

(62) Division of application No. 14/711,969, filed on May 14, 2015, now Pat. No. 9,293,397.

(51) Int. Cl.
*H01L 23/495* (2006.01)

(52) U.S. Cl.
CPC ..... *H01L 23/49562* (2013.01); *H01L 23/4952* (2013.01); *H01L 23/49503* (2013.01); *H01L 23/49537* (2013.01); *H01L 23/49586* (2013.01)

(58) Field of Classification Search
CPC .............. H01L 23/49562; H01L 23/49503; H01L 23/4952; H01L 23/49537; H01L 23/49586
See application file for complete search history.

(56) References Cited

U.S. PATENT DOCUMENTS

2014/0361420 A1* 12/2014 Yilmaz .................. H01L 24/41
257/676

* cited by examiner

*Primary Examiner* — Long Pham
(74) *Attorney, Agent, or Firm* — Chen-Chi Lin

(57) ABSTRACT

A power semiconductor package and a method of preparation are disclosed. The power semiconductor package includes a pair of first and second die paddles arranged side by side, a first semiconductor chip attached to the first die paddle, a second semiconductor chip attached to the second die paddle, a metal clip electrically connecting a first electrode at the top surface of the first semiconductor chip and a first electrode at the top surface of the second semiconductor chip to a second pin, a first conductive structure connecting a second electrode at the top surface of a first semiconductor chip to a first pin, and a second conductive structure connecting a second electrode at the top surface of the second semiconductor chip to a third pin. In examples of the present disclosure, double-chip common source technique for the source electrodes of two power MOSFETs is achieved by applying a T-shape metal clip.

9 Claims, 7 Drawing Sheets

POWER DEVICE AND PREPARATION METHOD THEREOF

CROSS-REFERENCE TO RELATED APPLICATIONS

This Patent Application is a Divisional Application of a pending application Ser. No. 14/711,969 filed on May 14, 2015. The Disclosure made in the patent application Ser. No. 14/711,969 is hereby incorporated by reference.

FIELD OF PRESENT INVENTION

The present invention mainly refers to a power semiconductor device, in particular, to a power semiconductor package device as a power switch and a preparation method thereof.

BACKGROUND OF RELATED ART

In a conventional power switching system, the voltage is modulated by a power switch to generate a final output voltage with a small ripple, for example, the switch includes a power semiconductor device. In a conventional semiconductor package as shown in FIG. 1, a power transistor T1 is attached on a first die paddle having pins D1 and a power transistor T2 is attached on a second die paddle having pins D2. The source and the gate of the transistor T1 are respectively connected to a pin S1 and a pin G1 via the bonding wires, and the source and the gate of the transistor T2 are respectively connected to a pin S2 and a pin G2 via the bonding wires. Some power switching system applies a common source for both power transistors, for example, the common source of double-chip T1 and T2 in FIG. 1 can be achieved at the external board level, in which the pin S1 and the pin S2 are attached to a common bonding pad of a circuit board or the pin S1 and the pin S2 are coupled together via two different conductive paths. The connecting path between two sources of the double-chip forming a common source of the conventional technique still needs to be improved, in particular without an increase in the size of the final package device. In examples of the present disclosure, double-chip common source technique for the source electrodes of two power MOSFETs is achieved by applying a T-shape metal clip.

It is within this context that embodiments of the present invention arise.

BRIEF DESCRIPTIONS OF THE DRAWINGS

The embodiments of this invention are described in more detail with reference to the accompanying drawings. However, the accompanying drawings are for the purpose of descriptions and illustrations only and do not impose limitation to the scope of the present invention:

DESCRIPTIONS OF THE SPECIFIC EMBODIMENTS

Figure 1:
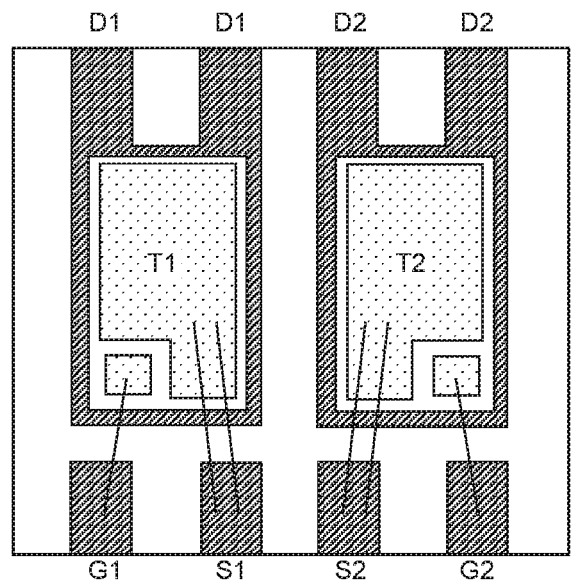
FIG. 1 represents a basic structure of a power package device in prior art.
Figure 2:
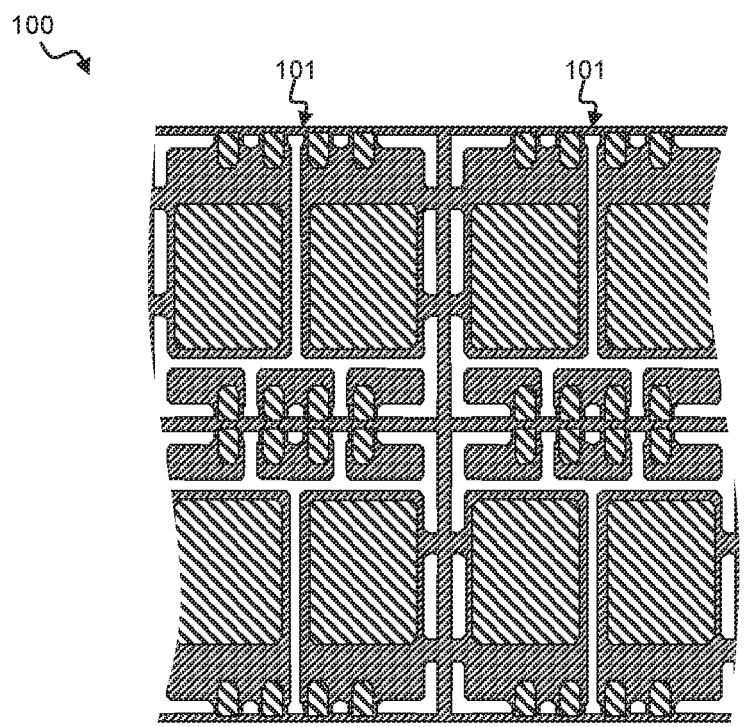
FIG. 2 is a top view of a lead frame used to form a power package device in the present invention.

FIG. 2 is a top view of a portion of a metal lead frame 100. The lead frame 100 includes a plurality of lead frame units 101.

Figure 3:
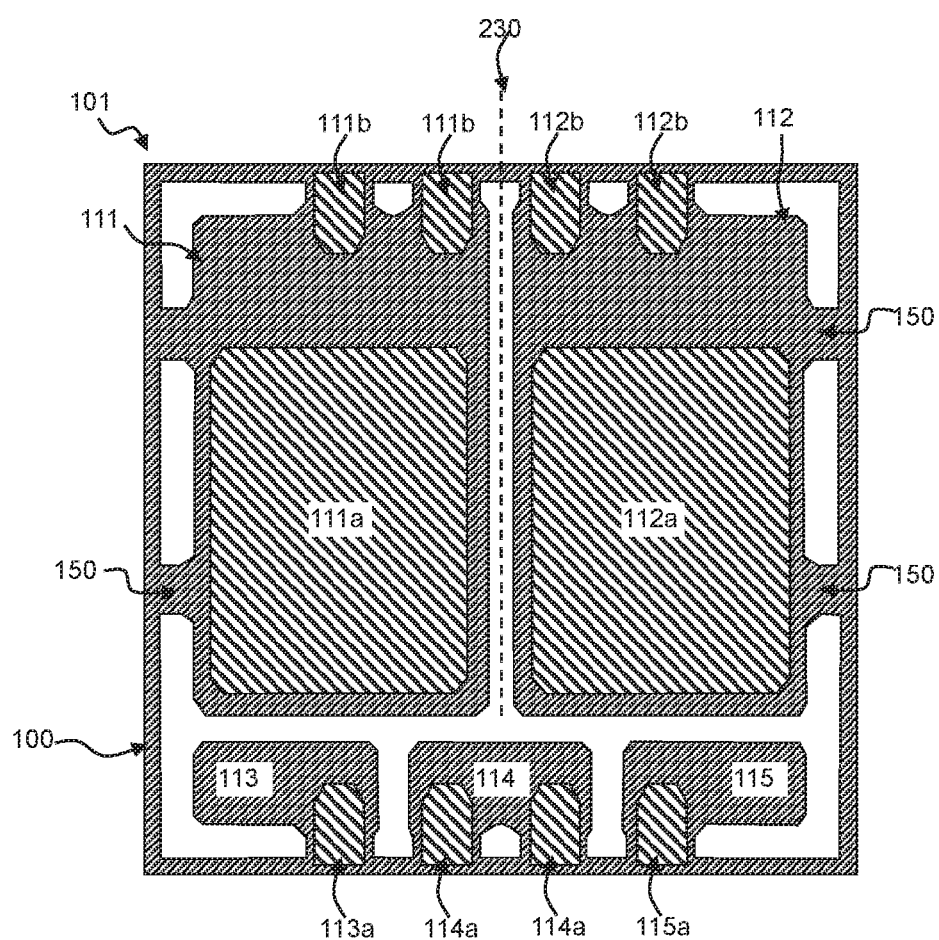
FIG. 3 is a top view of one lead frame unit of the lead frame in FIG. 2.

As shown in FIG. 3, each lead frame unit includes a first die paddle 111 and a second die paddle 112, a first pin 113, a second pin 114 and a third pin 115 separated from each other. In an embodiment, the first die paddle 111 and the second die paddle 112 can be cuboids or cubes, separated from each other and arranged side by side. The second pin 114 is located on a symmetric line or a cutting line 230 between the die paddle 111 and the die paddle 112. The first die paddle 111 and the second die paddle 112 are symmetric with respect to the cutting line 230. The first pin 113 and the third pin 115 are substantially collinear with and located on both sides of the second pin 114. The pins and the die paddles of the lead frame unit 101 are connected to the lead frame 100 via connecting bands 150. At least two connecting bands 150 are provided at each two adjacent sides of each of the die paddles 111 and 112 to connect the die paddles to the lead frame. On a common side of the first die paddle 111 and the second die paddle 112, a connecting band is disposed substantially at a center of each of the die paddle and another connecting band is disposed substantially at each edge where the first die paddle 111 and the second die paddle 112 are separated to stabilize the die paddles during die mounting process. The lead frame units 101 or the lead frame 100 are further subjected to additional processes before a die-attach step. For example, additional processes may include semi-etching or punching/impressing and other similar processes.

As shown in FIG. 3, the top surface of the die paddles 111 and 112 are etched or punched to form mesa structures 111a and 112a protruding out of the top surface of the lead frame unit 101. As an enhancement, upright posts 111b and 112b are arranged side by side on the common side of the die paddles 111 and 112, with a portion of each of the upright post 111b and 112b overlapped with each connecting band 150 connecting the die paddle 111 and die paddle 112 to the lead frame 100, forming a protruding out top surface by the same semi-etching or punching processes as described above. The upright posts 111b and 112b strengthen the connecting band 150 thus enhancing the die paddle stability. Furthermore the upright posts 113a, 114a and 115a, which are arranged side by side with a portion of each of the upright post 113a, 114a and 115a overlapped with a corresponding connecting band 150 connecting the first pin 113, the second pin 114 and the third pin 115 to the lead frame 100 respectively, protruding out of the top surfaces of the first pin 113, the second pin 114 and the third pin 115 respectively, also can be formed via a same semi-etching or punching process.

Figure 4:
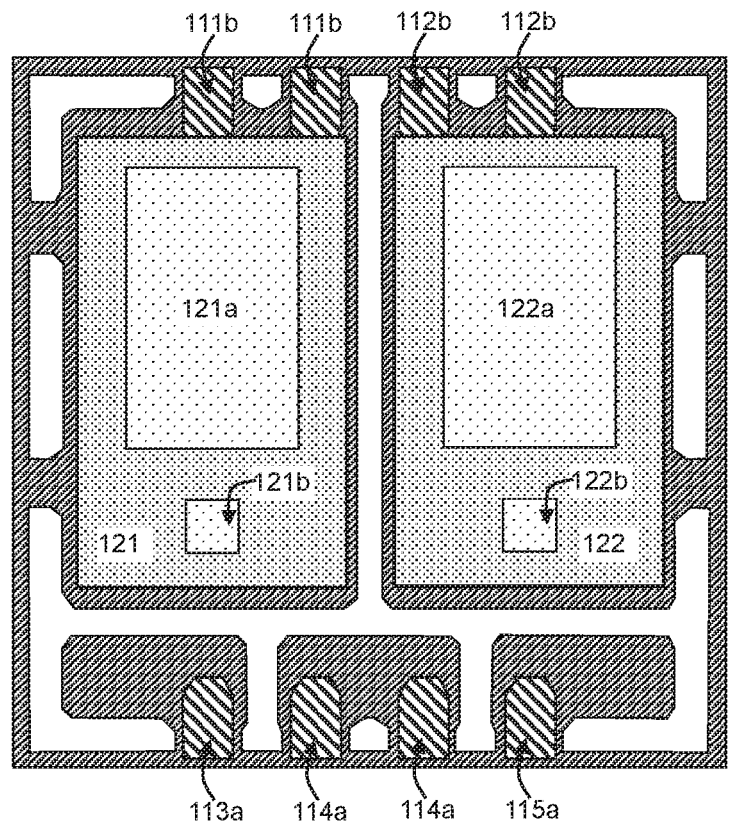
FIG. 4 is a top view of a lead frame unit with two semiconductor chips attached thereon.

As shown in FIG. 4, a first semiconductor chip 121 is attached on the mesa structure 111a at the top surface of the first die paddle 111 and a second semiconductor chip 122 is attached on the mesa structure 112a at the top surface of the second die paddle 112 via a conductive binding material. The first chip 121 and the second chip 122 can be vertical power MOSFETs, each of which includes a first electrode 121a or 122a, which is the source electrode, and a second electrode 121b or 122b, which is the gate electrode, insulated from each other arranged at the top surface, and the third electrode arranged at the bottom surface of the first chip 121 or the second chip 122 (not shown), which is the drain, attached on the top surface of the mesa structure 111a or 112a via a soldering paste or a conductive silver paste and other similar conductive binding materials. In addition, the bottom surface of the first chip 121 and the second chip 122 can also be respectively mounted on the top surface of the mesa structure 111a and the mesa structure 112a by eutectic bonding and other welding methods, so that the third electrode at the bottom surface of the first chip 121 is electrically connected with the first die paddle 111 and the third electrode at the bottom surface of the second chip 122 is electrically connected with the second die paddle 112. As an option, the upright post 111b on the die paddle 111 and the upright post 112b on the die paddle 112 are located at the central position of the common side of the die paddles 111 and 112 respectively. When the first chip 121 and the second chip 122 are large in size, the first chip 121 can be attached on the upright post 111b and the mesa structure 111a, and the second chip 122 can be attached on the upright post 112b and the mesa structure 112a. As shown in FIG. 4, the first chip 121 and the second chip 122 may be arranged side by side along with the die paddles.

Figure 5A:
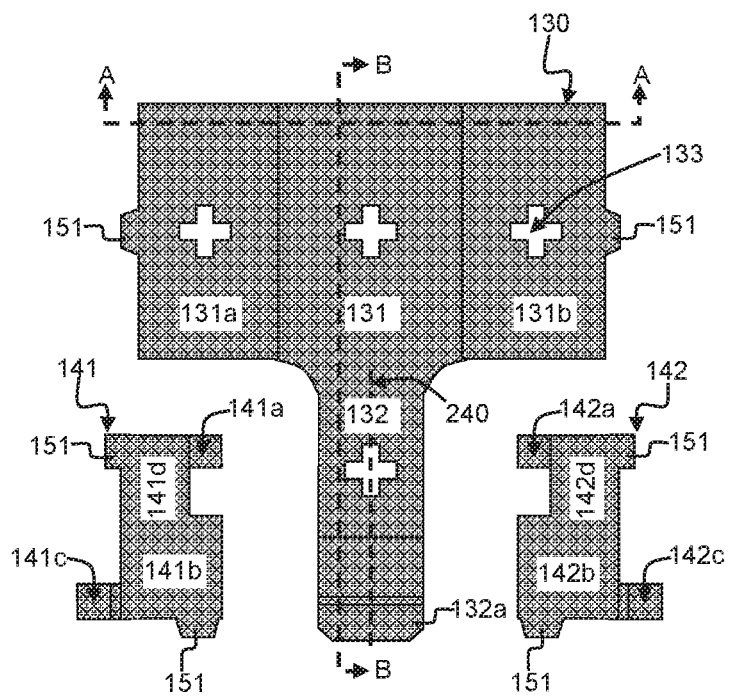
FIG. 5A to FIG. 5E are schematic diagrams of a metal clip and two conductive plates.

FIG. 5A to FIG. 5E are schematic diagrams illustrating a T-shape metal clip 130, a first conductive plate 141 and a second conductive plate 142 used in the power device of the present invention. The T-shape metal clip 130 includes a first portion 131 and a second portion 132 integrated in one piece, where the second portion 132 is perpendicular to the first portion 131 with one end of the second portion 132 connected to center area of the first portion 131. The T-shape metal clip 130, the first conductive plate 141 and the second conductive plate 142 are separated from each other. However, in a preferred embodiment, the T-shape metal clip 130, the first conductive plate 141 and the second conductive plate 142 can be connected with each other via connecting bands (not shown). In an embodiment, some connecting bands are cut off forming connectors 151 as shown in FIG. 5A. In another embodiment, the first portion 131 and the second portion 132 of the T-shape metal clip 130 include through holes 133. The shapes of the through holes 133 may include circles, squares, polygons or cross shapes. The cross shapes, as shown in FIG. 5A, are used as locked modes that will be described later in the step of coating plastic package. In one example, the T-shape metal clip 130 is connected with the conductive plate 141 and the conductive plate 142, the first conductive plate 141 and the second conductive plate 142 are located at both sides of the second portion 132 respectively and are symmetric with respect to the second portion 132, or symmetric with respect to a center line 240 of the second portion 132.

Figure 5B:
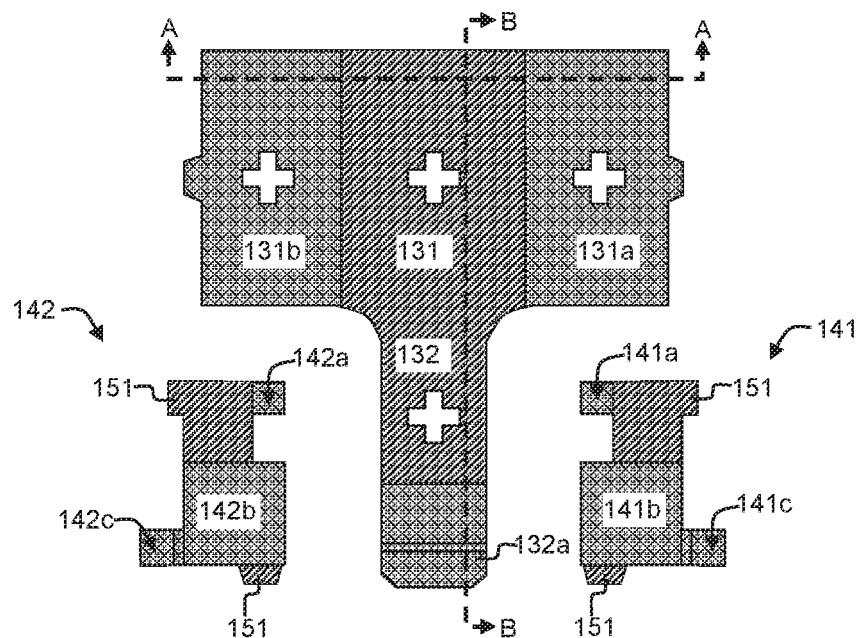
Figure 5C:
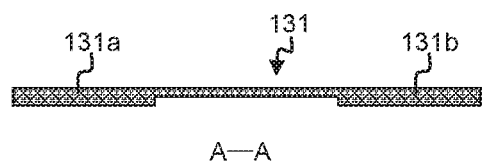
Figure 5D:
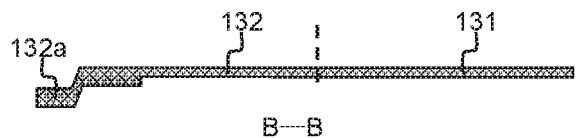

FIG. 5A shows the top surfaces of the T-shape metal clip 130, the first conductive plate 141 and the second conductive plate 142. FIG. 5B shows the bottom surfaces of the T-shape metal clip 130, the first conductive plate 141 and the second conductive plate 142. Comparing FIG. 5A and FIG. 5B, the positions of the first conductive plate 141 and the second conductive plate 142 are interchanged, and the positions of the end 131a and end 131b of the first portion 131 of the T-shape metal clip 130 are also interchanged. In FIG. 5B, a groove is formed at the bottom surface of the first portion 131 in the middle area between the end 131a and the end 131b using a semi-etching or punching mode, which extends to the second portion 132. FIG. 5C shows the cross-sectional diagram of the first portion 131 along a dotted line AA of FIG. 5A and FIG. 5B. FIG. 5D shows the cross-sectional diagram of the first portion 131 and the second portion 132 along a dotted line BB of FIG. 5A and FIG. 5B. One free end of the second portion 132 is firstly bent downward and then extended horizontally to form a down-set part 132a. The down-set part 132a may be made by punch molding. The plane of the down-set part 132a is substantially parallel to the plane of the first portion 131 and the plane of the second portion 132, but the plane of the first portion 131 and the plane of the second portion 132 are slightly higher than the plane of the down-set part 132a.

Figure 5E:
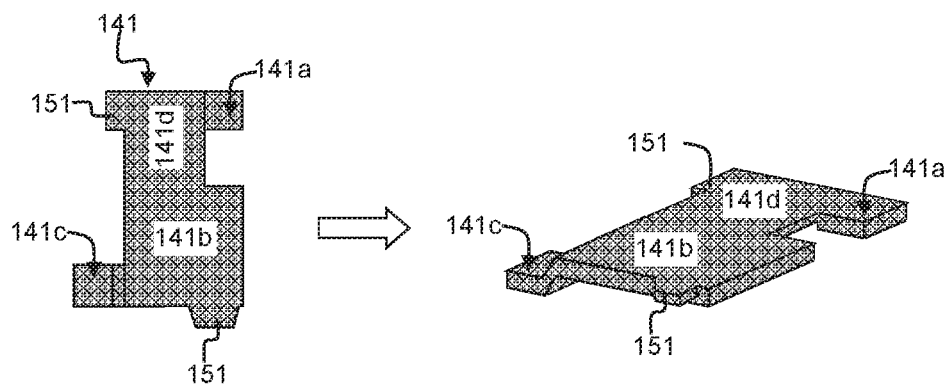

FIG. 5E shows a perspective view of the first conductive plate 141, which is similar to but is in mirror symmetry with respect to the second conductive plate 142. The first conductive plate 141 is a metal clip including a base 141b, an extending section 141d connected to the base 141b, a contact portion 141a extending from one edge of the extending section 141d near the second portion 132 of the T-shape metal clip 130 and away from the base 141b, and a down-set part 141c extending on the outside edge of the base 141b away from the extending section 141d. The down-set part 141c is located on a plane lower and parallel with the plane of the base 141b and the extending section 141d. The extending section 141d is thinner than the base 141b, which is formed by a semi-etching or punching process. The bottom surface of the base 141b is coplanar with the bottom surface of the contact portion 141a. The bottom surface of the extending section 141d is recessed from the bottom surface of the base 141b and the contact portion 141a. Similarly, as shown in FIG. 5A-5B, the second conductive plate 142 includes a base 142b and an extending section 142d connected with each other, a contact portion 142a extends from one edge of the extending section 142d near the second portion 132 of the T-shape metal clip 130 and away from the base 142b, and a down-set part 142c extending on the outside edge of the base 142b away from the extending section 142d. The down-set part 142c is located on a plane below and essentially parallel to the plane of the base 142b and the extending section 142d. The extending section 142d is thinner than the base 142b, which is formed by semi-etching or punching process. The bottom surface of the base 142b is coplanar with the bottom surface of the contact portion 142a. The bottom surface of the extending section 142d is recessed from the bottom surface of the base 142b and the contact portion 142a. As such, each of the first conductive plate 141 and the second conductive plate 142 includes different sections integrated in one piece.

Figure 6:
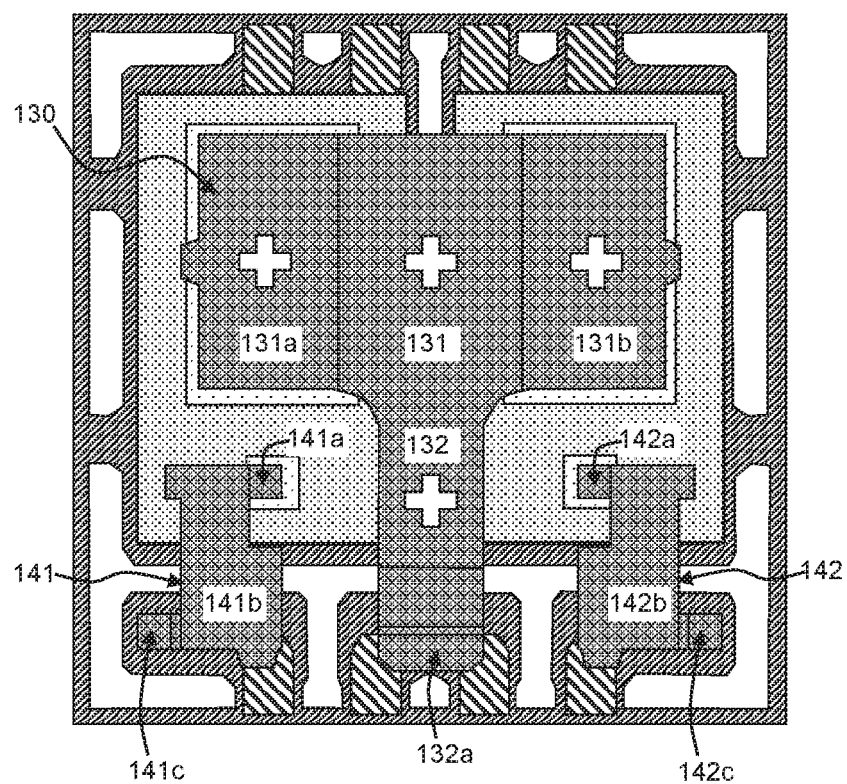
FIG. 6 is a top view showing the metal clip and two conductive plates mounted on two semiconductor chips attached on the lead frame unit in FIG. 4.

As shown in FIG. 6, a conductive binding material is coated on the first electrode 121a and the second electrode 121b at the top surface of the first chip 121 and on the first electrode 122a and the second electrode 122b at the top surface of the second chip 122. In addition, the conductive binding material is coated on the top surfaces of the first pin 113, the third pin 115, the second pin 114, and the upright post 114a if the upright post 114a is formed. Then, the T-shape metal clip 130 is attached on the first chip 121, the second chip 122 and the second pin 114. The first conductive plate 141 is attached on the first chip 121 and the first pin 113. The second conductive plate 142 is attached on the second chip 122 and the third pin 115. Specifically, the first portion 131 of the T-shape metal clip 130 is mounted above the first chip 121 and the second chip 122. The bottom surface of one end 131a of the first portion 131 is aligned with and attached on the first electrode 121a of the first chip 121. The bottom surface of the other end 131b of the first portion 131 is aligned with and attached on the first electrode 122a of the second chip 122. The down-set part 132a at the free end of the second portion 132 is attached on the top surface of the second pin 114. The down-set part 132a may be aligned with and attached on the top surface of the upright post 114a. The contact portion 141a of the first conductive plate 141 is aligned with and attached on the second electrode 121b at the top surface of the first chip 121. The down-set part 141c of the first conductive plate 141 is aligned with and attached on the top surface of the first pin 113. The contact portion 142a of the second conductive plate 142 is aligned with and attached on the second electrode 122b at the top surface of the second chip 122 The down-set part 142c of the second conductive plate 142 is aligned with and attached on the top surface of the third pin 115.

In an embodiment, if the T-shape metal clip 130, the first conductive plate 141 and the second conductive plate 142 are connected with each other via the connecting bands, the steps of attaching the T-shape metal clip 130, the first conductive plate 141 and the second conductive plate 142 on the first and second chips 121 and 122 and the pins 113-115 are carried out the same time and the connecting bands are cut off subsequently. Otherwise, the T-shape metal clip 130, the first conductive plate 141 and the second conductive plate 142 can be attached on the first and second chips 121 and 122 and the pins 113-115 separately in an arbitrary sequence. The base 141b of the first conductive plate 141 is partially overlapped on the upright post 113a of the first pin 113. The base 142b of the second conductive plate 142 is partially overlapped on the upright post 115a of the third pin 115. The symmetrical center line 240 between two long edges of the second portion 132 in FIG. 5A can be superimposed with the cutting line 230 between the die paddle 111 and the die paddle 112 in FIG. 3.

Figure 7:
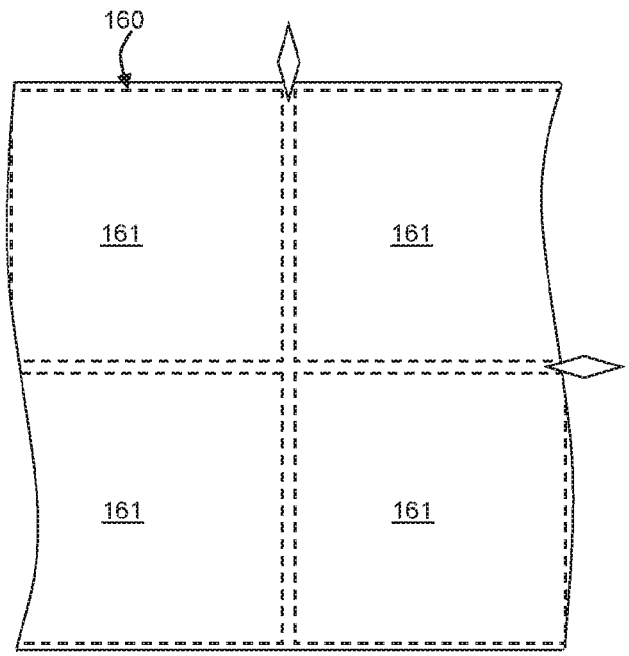
FIG. 7 is a top view showing a plastic package layer covering a lead frame with the semiconductor chips, metal clip and conductive structures attached thereon.

Referring to FIG. 7, after the first chip 121 and the second chip 122 are respectively attached on the die paddles 111 and 112 of the lead frame unit 101 in the lead frame 100 and the T-shape metal clip 130, the first conductive plate 141 and the second conductive plate 142 are subsequently mounted atop of the first chip 121 and the second chip 122, a plastic package material, such as epoxy resin and the like, is deposited forming a plastic package layer 160. The plastic package layer 160 covers the first chip 121 and the second chip 122, the lead frame unit 101, the T-shape metal clip 130, the first conductive plate 141 and the second conductive plate 142. The bottom surfaces of the die paddle 111, the die paddle 112, the first pin 113, the second pin 114 and the third pin 115 in each lead frame unit 101 are exposed (not covered by the plastic package layer 160). In addition, the plastic package material also fills in through holes 133 under the molding pressure to firmly lock the T-shape metal clip 130 to the first and second chips 121, 122 and the lead frame unit 101. FIG. 7 is a top view of the devices after the plastic package layer 160 is formed. Then, the standard package cutting process is carried out to cut through the laminate from the plastic package layer 160 to the lead frame 100 between the adjacent lead frame units 101 along the preset cutting line (dotted line in FIG. 7) forming a plurality of complete package devices. In this step, each lead frame unit 101 is cut off and separated from the lead frame 100 and a plurality of plastic package bodies 161 are formed via cutting the plastic package layer 160. Each plastic package body 161 correspondingly covers one lead frame unit 101. In addition, the connecting bands 150 are also cut off, so that the die paddle 111, the die paddle 112, the first pin 113, the second pin 114 and the third pin 115 are separated from the lead frame 100.

Figure 8:
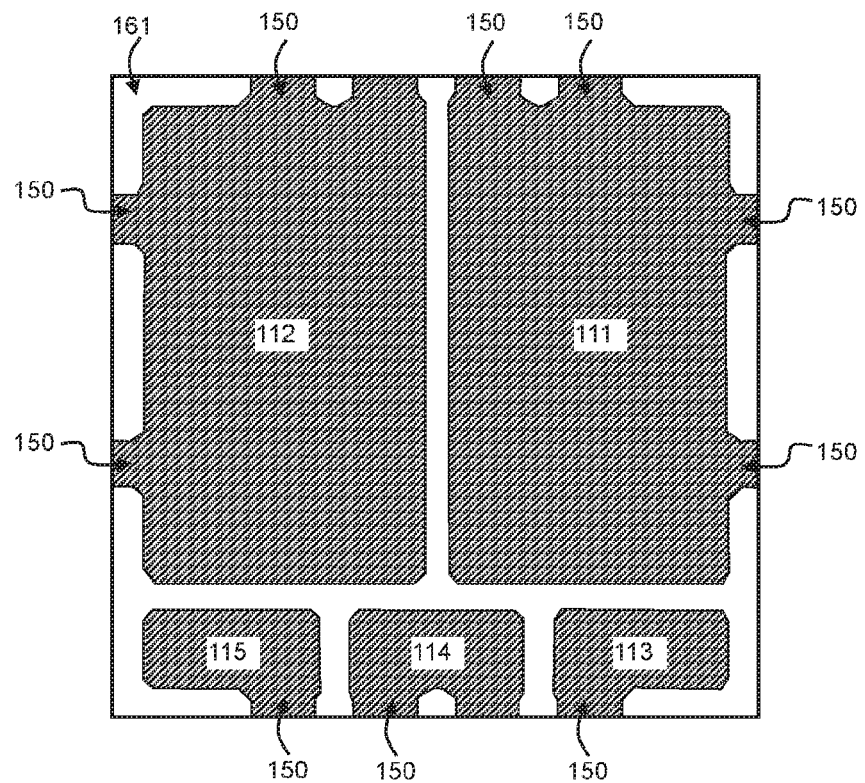
FIG. 8 is a bottom view of a power device with a plastic package body.

FIG. 8 shows the bottom view of a complete package device including a plastic package body 161 coated on the first die paddle 111, the second die paddle 112, the first pin 113, the second pin 114, the third pin 115, the first chip 121, the second chip 122, the T-shape metal clip 130, the first conductive plate 141, the second conductive plate 142, and the upright posts 111b, 112b, 113a, 114a and 115a. The bottom surfaces of the first pin 113, the second pin 114, the third pin 115, the die paddle 111 and the die paddle 112 are exposed as contact terminals for connecting to external devices. In an optional embodiment, the top surface of the T-shape metal clip 130 can be exposed (not covered by the top surface of the plastic package body 161), but the down-set part 132a is not exposed (covered by the top surface of the plastic package body 161) since the down-set part 132a is bent and located in a lower plane. Similarly, the top surfaces of the first conductive plate 141 and the second conductive plate 142 can be exposed (not covered by the top surface of the plastic package body 161), but the down-set parts 141c and 142c is not exposed (covered by the top surface of the plastic package body 161).

Figure 9:
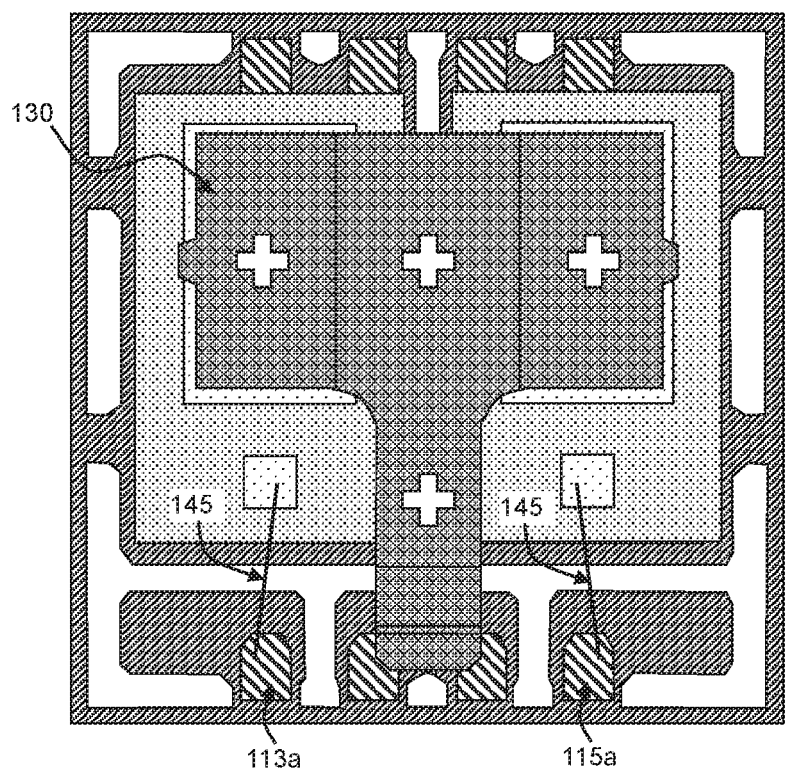
FIG. 9 is a top view of another power device with the conductive plates of FIG. 6 being replaced by bonding wires.

In an optional embodiment shown in FIG. 9, the first conductive plate 141 and the second conductive plate 142 of FIG. 6 are replaced with metal bonding wires 145. The metal bonding wires 145 connect the second electrode 121b at the top surface of the first chip 121 and the second electrode 122b at the top surface of the second chip 122 to the first pin 113 and third pin 115 respectively. For example, a first metal bonding wire may connect to the upright post 113a and a second metal bonding wire may connect to the upright post 115a It can be done before or after attaching the T-shape metal clip 130 on the first and second chips 121 and 122. The metal bonding wires 145 can also be replaced by metal conduction bands and the likes. As such, double-chip common source for the source electrode 121a and the source electrode 122a of two power MOSFETs 121 122 respectively via the T-shape metal clip 130 is achieved.

Those of ordinary skill in the art may recognize that modifications of the embodiments disclosed herein are possible. For example, the number of lead frame units in a lead frame may vary. Other modifications may occur to those of ordinary kill in this art, and all such modifications are deemed to fall within the purview of the present invention, as defined by the claims.

The invention claimed is:

1. A power device comprising:
   a pair of first and second die paddles arranged side by side;
   a pair of first and second semiconductor chips, the first semiconductor chip being attached to the first die paddle and the second semiconductor chip being attached to the second die paddle;
   a first pin, a second pin and a third pin located in proximity to the first and second die paddles;
   a metal clip electrically connecting a first electrode at a top surface of the first semiconductor chip and a first electrode at a top surface of the second semiconductor chip to the second pin;
   a first conductive structure connecting a second electrode at the top surface of the first semiconductor chip to the first pin; and a second conductive structure connecting a second electrode at the top surface of the second semiconductor chip to the third pin;

wherein the metal clip is of T-shape configuration comprising a first portion and a second portion perpendicular to the first portion;

wherein the first portion of the metal clip overlaps on the pair of the first and second semiconductor chips attached to the first and second die paddles respectively;

wherein one end of the first portion of the metal clip is attached to the first electrode at the top surface of the first semiconductor chip and another end of the first portion of the metal clip is attached to the first electrode at the top surface of the second semiconductor chip; and wherein a free end of the second portion of the metal clip is bent down and extends horizontally to form a down-set portion attached to the second pin.

2. The power device of claim 1, wherein the second pin is located on a cutting line between the pair of the first and second die paddles; wherein the first pin and the third pin are located at both sides of the second pin respectively; wherein the first and second conductive structures are located at both sides of the second portion of the metal clip respectively; and wherein the first and second conductive structures are symmetric with respect to the second portion of the metal clip.

3. The power device of claim 1, wherein the first portion and the second portion of the metal clip comprise one or more through holes.

4. The power device of claim 1, wherein the first or second conductive structure is a metal bonding wire.

5. The power device of claim 1, wherein each of the first and second conductive structures is a metal plate comprising a base, an extending section connected to the base, a contact portion extending from one edge of the extending section adjacent to the second portion of the metal clip, and a down-set portion extending from one edge of the base away from the second portion of the metal clip;

wherein each of the contact portions of the first and second conductive structures is attached to the second electrode of the first or second semiconductor chip respectively;

wherein the down-set portion of the first conductive structure is attached to the first pin; and wherein the down-set portion of the second conductive structure is attached to the third pin.

6. The power device of claim 5, wherein the extending section is thinner than the base, and the base and the contact portion have similar thickness.

7. The power device of claim 1, wherein a mesa structure forms a protrusion out of a top surface of the first die paddle and another mesa structure forms a protrusion out of the second die paddle for bearing the first and second semiconductor chips; and wherein one or more upright posts form protrusions out of a top surface of the second pin for bearing the down-set portion at the free end of the second portion of the metal clip.

8. The power device of claim 1, wherein the first and second semiconductor chips are power MOSFETs;

wherein source electrodes at the top surfaces of the first and second semiconductor chips are electrically connected together via the metal clip;

wherein a drain electrode at a bottom surface of the first semiconductor chips is electrically connected to the first die paddle via a conductive binding material, wherein a drain electrode at a bottom surface of the second semiconductor chip is electrically connected to the second die paddle via another conductive binding material; and wherein gate electrodes of the first and second semiconductor chips are electrically connected to the first pin and the third pin respectively.

9. The power device of claim 1 further comprising a plastic package body covering the first and second die paddles, the first pin, the second pin, the third pin, the first and second semiconductor chips, the first and second conductive structures and the metal clip, wherein bottom surfaces of the first pin, the second pin, the third pin and the first and second die paddles are exposed.

* * * * *